United States Patent
Shim

(10) Patent No.: US 8,222,587 B2
(45) Date of Patent: Jul. 17, 2012

(54) IMAGE SENSOR AND METHOD FOR MANUFACTURING THE SAME

(75) Inventor: Hee Sung Shim, Gangwon-do (KR)

(73) Assignee: Dongbu Hitek Co., Ltd., Seoul (KR)

( * ) Notice: Subject to any disclaimer, the term of this patent is extended or adjusted under 35 U.S.C. 154(b) by 417 days.

(21) Appl. No.: 12/636,290

(22) Filed: Dec. 11, 2009

(65) Prior Publication Data

US 2010/0148034 A1 Jun. 17, 2010

(30) Foreign Application Priority Data

Dec. 17, 2008 (KR) .................. 10-2008-0128500

(51) Int. Cl.
*H01J 40/14* (2006.01)
*H01L 31/02* (2006.01)

(52) U.S. Cl. ............ 250/208.1; 257/292; 438/141

(58) Field of Classification Search ............ 250/208.1; 257/290–293; 438/141
See application file for complete search history.

(56) References Cited

U.S. PATENT DOCUMENTS

| | | | |
|---|---|---|---|
| 2009/0072282 A1* | 3/2009 | Lee | 257/292 |
| 2009/0174025 A1* | 7/2009 | Hwang | 257/463 |
| 2009/0258462 A1* | 10/2009 | Konevecki et al. | 438/128 |
| 2010/0025801 A1* | 2/2010 | Han | 257/461 |
| 2010/0059846 A1* | 3/2010 | Kim | 257/448 |
| 2010/0078686 A1* | 4/2010 | Hwang | 257/225 |
| 2010/0093128 A1* | 4/2010 | Jung | 438/98 |
| 2010/0117174 A1* | 5/2010 | Jung | 257/431 |

* cited by examiner

*Primary Examiner* — Seung C Sohn
(74) *Attorney, Agent, or Firm* — Saliwanchik, Lloyd & Eisenschenk

(57) ABSTRACT

Provided are an image sensor and a method for manufacturing the same. The image sensor comprises a readout circuitry, an interconnection, an image sensing device, a first conductive-type ion implantation layer, and a via plug. The readout circuitry is formed in a first substrate. The interconnection is formed over the first substrate. The interconnection is electrically connected to the readout circuitry. Then image sensing device is formed over the interconnection. The image sensing device comprises a first conductive-type conductive layer and a second conductive-type conductive layer. The first conductive-type ion implantation layer is formed in a portion of the second conductive-type conductive layer of the image sensing device. The via plug penetrates through the first conductive-type ion implantation layer and the first conductive-type conductive layer to electrically connect the first conductive-type conductive layer to the interconnection.

20 Claims, 5 Drawing Sheets

IMAGE SENSOR AND METHOD FOR MANUFACTURING THE SAME

CROSS-REFERENCE TO RELATED APPLICATION

This application claims the benefit under 35 U.S.C. §119 of Korean Patent Application No. 10-2008-0128500, filed Dec. 17, 2008, which is hereby incorporated by reference in its entirety.

BACKGROUND

The present disclosure relates to an image sensor and a method for manufacturing the same.

Image sensors are semiconductor devices which can convert optical images into electrical signals. Such image sensors can typically be classified as either a Charge Coupled Device (CCD) or a Complementary Metal Oxide Semiconductor (CMOS) Image Sensor (CIS).

During the fabrication of image sensors, a photodiode may be formed in a substrate using ion implantation. As the size of a photodiode is reduced for the purpose of increasing the number of pixels without increasing chip size, the area of a light receiving portion is also reduced, thereby resulting in a reduction in image quality.

Also, since a stack height does not reduce as much as the reduction in the area of the light receiving portion, the number of photons incident to the light receiving portion is also being reduced due to diffraction of light called Airy disk.

As an alternative to overcome this limitation, an attempt of forming a photodiode using amorphous silicon (Si), or forming a readout circuitry in a silicon (Si) substrate using a method such as wafer-to-wafer bonding, and forming a photodiode on and/or over the readout circuitry has been made (referred to as a "three-dimensional (3D) image sensor"). The photodiode is connected with the readout circuitry through a metal interconnection.

In the manufacture of a 3D image sensor according to a related-art, there are difficulties in performing a wafer-to-wafer alignment between a photodiode positioned at an upper part of a chip and a readout circuit unit formed in a silicon substrate, and ensuring an ohmic contact due to a poor contact between an interconnection of the readout circuit unit and the photodiode.

Also, there is a limitation in that an image defect is generated by damage to an image sensing device such as an etching damage because a pixel isolation region is formed by using a device isolation layer in a related-art.

According to a related-art, there is a limitation in that a charge sharing phenomenon may occur because both the source and the drain of the transfer transistor are heavily doped with N-type impurities. The charge sharing phenomenon may cause reduction of the sensitivity of an output image and generation of image error. Also, photo charges may not smoothly move between a photodiode and a readout circuitry, causing generation of a dark current and reduction of saturation and sensitivity.

BRIEF SUMMARY

Embodiments provide an image sensor and a method of manufacturing the same, which do not require a wafer-to-wafer alignment for connection between an image sensing device at an upper part of the image sensor and a readout circuitry at a lower portion, and can acquire an ohmic contact between an interconnection of the readout circuitry and the image sensing device.

Embodiments also provide an image sensor and a method for manufacturing the same, which can efficiently and stably form a pixel isolation region for an image sensing device.

Embodiments also provide an image sensor and a method for manufacturing the same, which can increase a fill factor without a charge sharing phenomenon.

Embodiments also provide an image sensor and a method for manufacturing the same, which can minimize a dark current source and inhibit saturation reduction and sensitivity degradation by forming a smooth transfer path of photo charges between an image sensing device and a readout circuit.

In one embodiment, an image sensor comprises: a readout circuitry in a first substrate; an interconnection over the first substrate, the interconnection being electrically connected to the readout circuitry; an image sensing device over the interconnection, the image sensing device comprising a first conductive-type conductive layer and a second conductive-type conductive layer; a first conductive-type ion implantation layer in a portion of the second conductive-type conductive layer of the image sensing device; and a via plug penetrating through the first conductive-type ion implantation layer and connecting the first conductive-type conductive layer to the interconnection.

In another embodiment, a method for manufacturing an image sensor comprises: forming a readout circuitry in a first substrate; forming an interconnection over the first substrate, the interconnection being electrically connected to the readout circuitry; forming an image sensing device over the interconnection, the image sensing device comprising a first conductive-type conductive layer and a second conductive-type conductive layer; forming a first conductive-type ion implantation layer in a portion of the second conductive-type conductive layer; and forming a via plug penetrating through the first conductive-type ion implantation layer and connecting the first conductive-type conductive layer to the interconnection.

The details of one or more embodiments are set forth in the accompanying drawings and the description below. Other features will be apparent from the description and drawings, and from the claims.

DETAILED DESCRIPTION

Hereinafter, embodiments of an image sensor and a method of manufacturing the same will be described with reference to the accompanying drawings.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, or one or more intervening layers may also be present. In addition, it will also be understood that when a layer is referred to as being 'between' two layers, it can be the only layer between the two layers, or one or more intervening layers may also be present.

Figure 1:
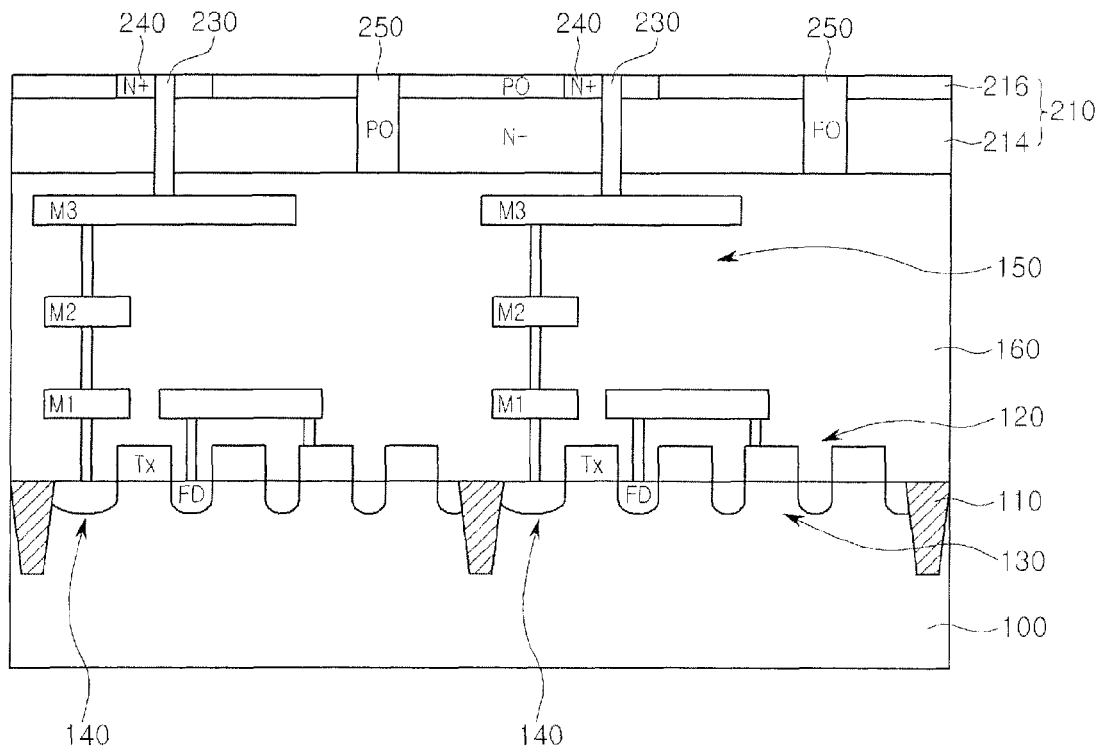
FIG. 1 is a cross-sectional view of an image sensor according to a first embodiment.

FIG. 1 is a cross-section view of an image sensor according to a first embodiment.

Referring to FIG. 1, an image sensor may include: a readout circuitry 120 in a first substrate 100; an interconnection 150 over the first substrate 100, the interconnection 150 being electrically connected to the readout circuitry 120; an image sensing device 210 over the interconnection 150, the image sensing device 210 including a first conductive-type conductive layer 214 and a second conductive-type conductive layer 216; a first conductive-type ion implantation layer 240 in a portion of the second conductive-type conductive layer 216 of the image sensing device 210; and a via plug 230 penetrating through the first conductive-type ion implantation layer 240 and connecting the first conductive-type conductive layer 214 to the interconnection 150.

The image sensing device 210 may be a photodiode, but, without being limited thereto, may be a photogate, or a combination of the photodiode and the photogate. Embodiments include the image sensing device 210 formed in a crystalline semiconductor layer as an example, but without being limited thereto, include a photodiode formed in an amorphous semiconductor layer.

Unexplained reference numerals in FIG. 1 will be described with reference to the drawings illustrating a method for manufacturing the image sensor below.

Hereinafter, a method for manufacturing an image sensor according to a first embodiment will be described with reference to FIGS. 2 through 8.

Figure 2:
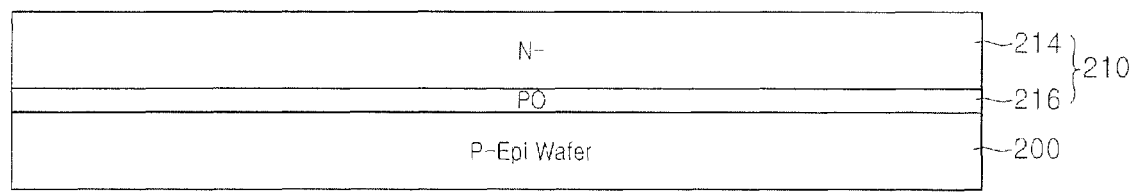
FIGS. 2 through 8 are cross-sectional views of a method for manufacturing an image sensor according to a first embodiment.

Referring to FIG. 2, an image sensing device 210 is formed on a second substrate 200. For example, a photodiode 210 including a P-type conductive layer 216, and a low-concentration N-type conductive layer 214 may be formed by implanting ions into a crystalline semiconductor layer, but embodiments are not limited thereto.

Figure 3A:
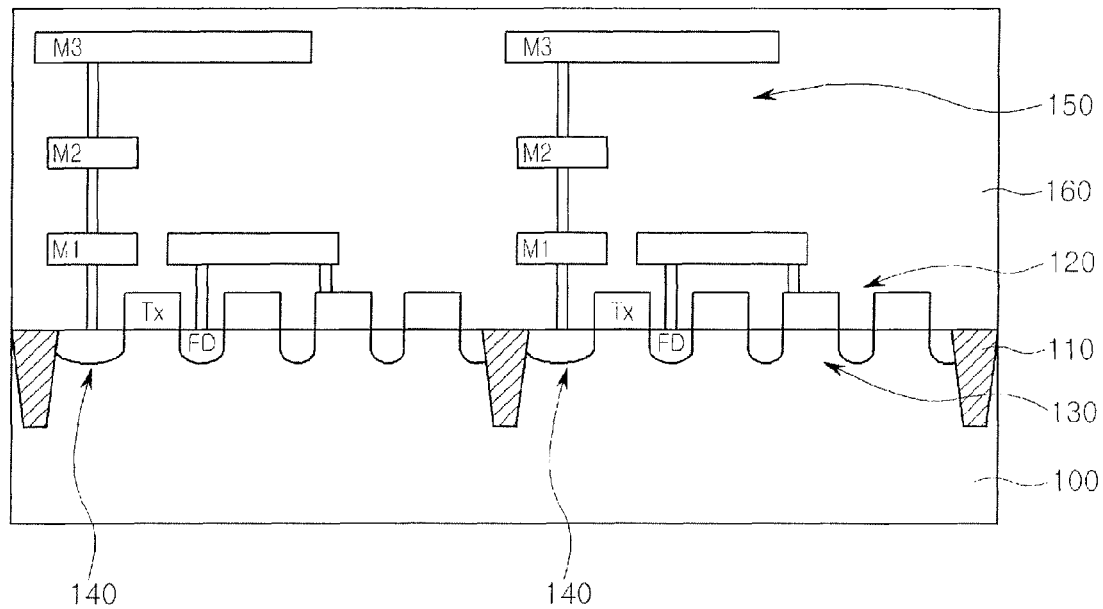
Figure 3B:
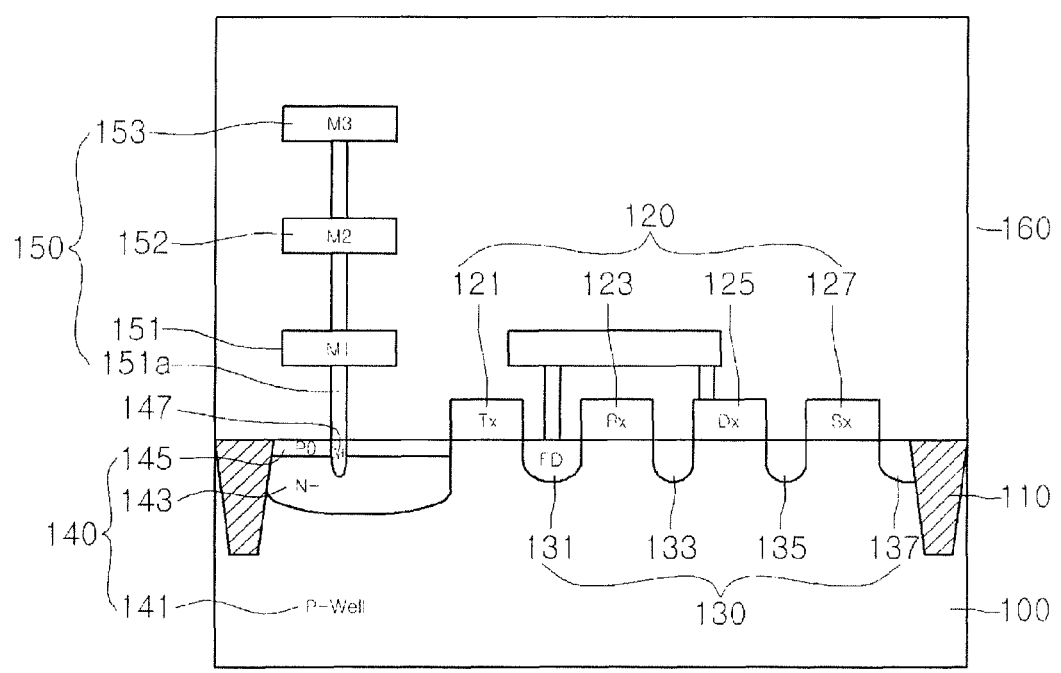

As shown in FIG. 3A, a first substrate 100 where an interconnection 150 and a readout circuitry 120 are formed is prepared. FIG. 3B is a detailed view illustrating the first substrate 100 where the interconnection 150 and the readout circuitry 120 are formed according to one embodiment. Hereinafter, detailed descriptions will be made with reference to FIG. 3B.

Referring to FIG. 3B, the first substrate 100 including the interconnection 150 and the readout circuitry 120 is prepared. For example, a device isolation layer 110 is formed in the first substrate 100 to define active regions. The readout circuitry 120 including a transistor is formed in the active region. For example, the readout circuitry 120 may include a transfer transistor (Tx) 121, a reset transistor (Rx) 123, a drive transistor (Dx) 125, and a select transistor (Sx) 127. An ion implantation region 130 including a floating diffusion region 131 and source/drain regions 133, 135 and 137 for the respective transistors may be formed.

The forming of the readout circuitry 120 in the first substrate 100 may include forming an electrical junction region 140 in the first substrate 100, and forming a first conductive-type connection 147 connected to the interconnection 150 at an upper portion of the electrical junction region 140.

For example, the electrical junction region 140 may be a P-N junction 140, but is not limited thereto. For example, the electrical junction region 140 may include a first conductive-type ion implantation layer 143 formed on a second conductive-type well 141 or a second conductive-type epitaxial layer, and a second conductive-type ion implantation layer 145 formed on the first conductive-type ion implantation layer 143. For example, as shown in FIG. 3B, the P-N junction 140 may be a P0(145)/N−(143)/P−(141) junction, but is not limited thereto. The first substrate 100 can be a second conductive-type, but is not limited thereto.

According to an embodiment, a device may be designed to provide a potential difference between the source and drain of a transfer transistor (Tx), thus enabling the full dumping of a photo charge. Accordingly, photo charges generated in a photodiode may be dumped to a floating diffusion region, thereby increasing sensitivity of an output image.

That is, as described with respect to FIG. 3B, the electrical junction region 140 may be formed in the first substrate 100 including the readout circuit 120 to provide a potential difference between the source and drain of the transfer transistor (Tx) 121, thereby enabling the full dumping of photo charges.

Hereinafter, a photo charge dumping structure according to an embodiment will be described in detail.

According to an embodiment, unlike a second floating diffusion (FD) 131 node of an N+ junction, the P/N/P junction 140 of the electrical junction region 140 is pinched off at a predetermined voltage without full delivery of an applied voltage. This voltage is called a pinning voltage. The pinning voltage depends on the P0 (145) and N− (143) doping concentration.

Thus, unlike a case where a photodiode is merely connected using an N+ junction as in a related-art, this embodiment can avoid saturation reduction and sensitivity degradation.

Thereafter, a first conductive-type connection 147 is formed between the photodiode and the readout circuit to create a smooth transfer path of photo charges, thereby making it possible to minimize a dark current source and inhibit saturation reduction and sensitivity degradation.

For this, in the first embodiment, a first conductive-type connection 147 for an ohmic contact may be formed on the surface of the P0/N−/P− junction 140. The N+ region 147 may be formed to contact N− 143 through the P0 145.

The width of the first conductive-type connection 147 may be minimized to inhibit the first conductive-type connection 147 from becoming a leakage source. For this, in the embodiment, a plug implant may be performed after etching a contact hole of a first metal contact 151a, but is not limited thereto. As another example, an ion implantation pattern (not shown) may be formed, and then the first conductive-type connection 147 may be formed using the ion implantation pattern as an ion implantation mask.

That is, reasons why an N+ doping is locally performed only on a contact formation region as described in the first embodiment include minimizing a dark signal and facilitating formation of an ohmic contact. If the entire Tx source region is doped with N+ type like the related art, a dark signal may increase due to a Si surface dangling bond.

Next, an interlayer dielectric 160 may be formed on the first substrate 100, and an interconnection 150 may be formed. The interconnection 150 may include the first metal contact 151a, a first metal 151, a second metal 152, and a third metal 153, but embodiments are not limited thereto.

Figure 4:
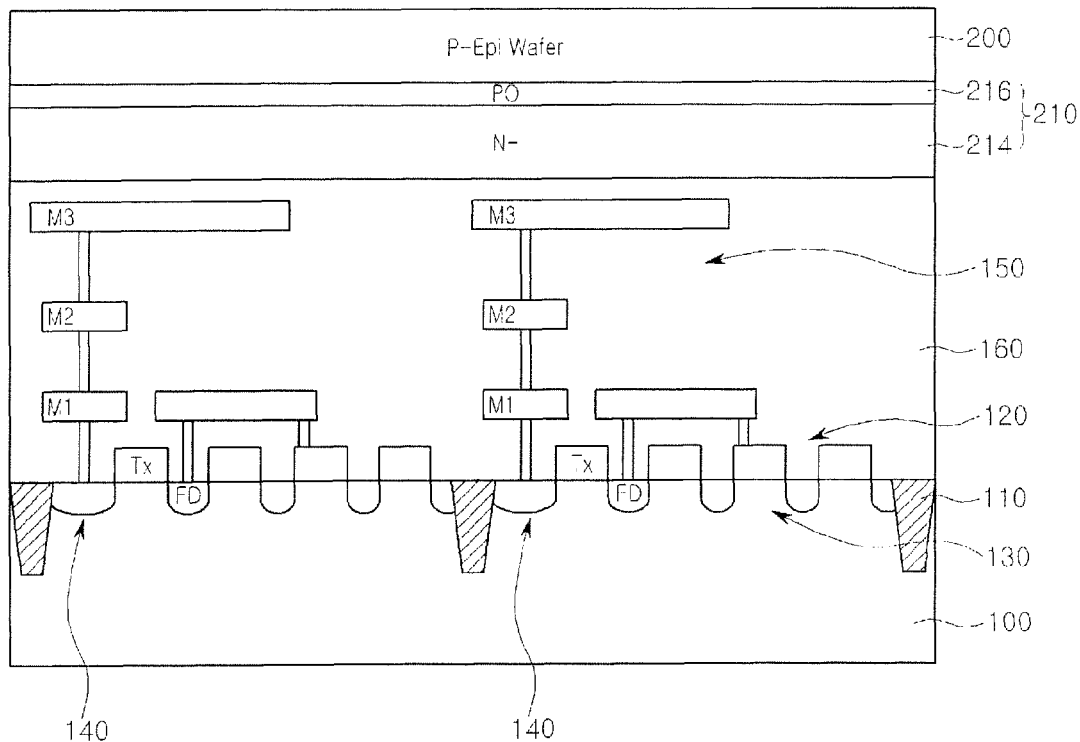
Figure 5:
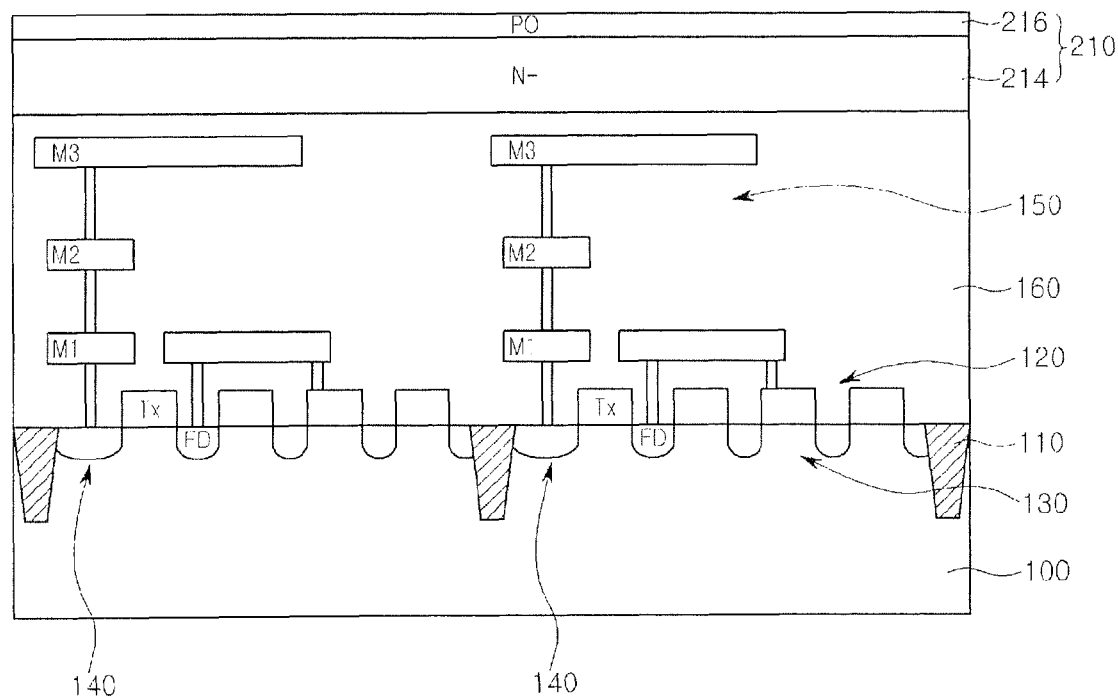

Next, as shown in FIG. 4, the second substrate 200 where the image sensing device 210 is formed is bonded over the interconnection 150, and then a portion of the second substrate 200 is removed to leave the image sensing device 210 as shown in FIG. 5.

Figure 6:
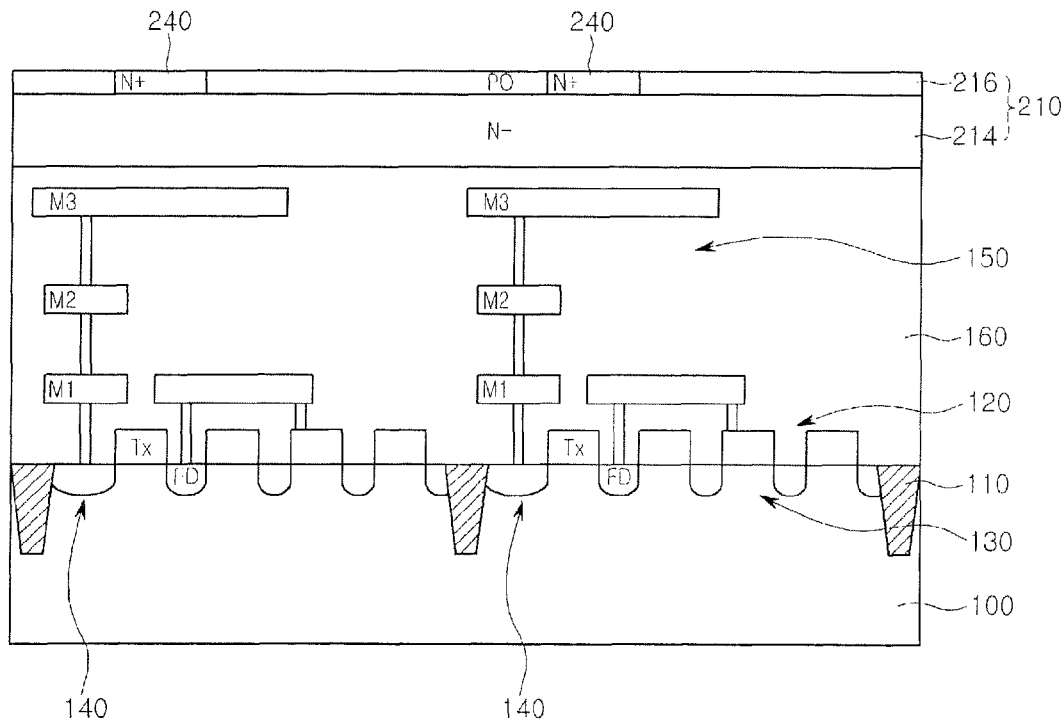

Next, as shown in FIG. 6, a first conductive-type ion implantation layer 240 is formed in a portion of a second conductive-type conductive layer of the exposed image sensing device 210. For example, a high-concentration N-type (n+) ion implantation layer 240 may be formed in the second conductive-type conductive layer 216, facilitating the formation of a via plug 230.

That is, in the method for forming an image sensor according to an embodiment, processes are efficiently performed without a wafer-to-wafer alignment for connection of the image sensing device and the readout circuitry. Also, a voltage can be applied to the image sensing device through the via plug connected to the interconnection after the N+ ion implantation, thereby acquiring an ohmic contact between the interconnection of readout circuitry and the image sensing device.

The first conductive-type ion implantation layer 240 may be formed to have a depth greater than that of the second conductive-type conductive layer 216, thereby inhibiting a short-circuit caused by the via plug described below.

Figure 7:
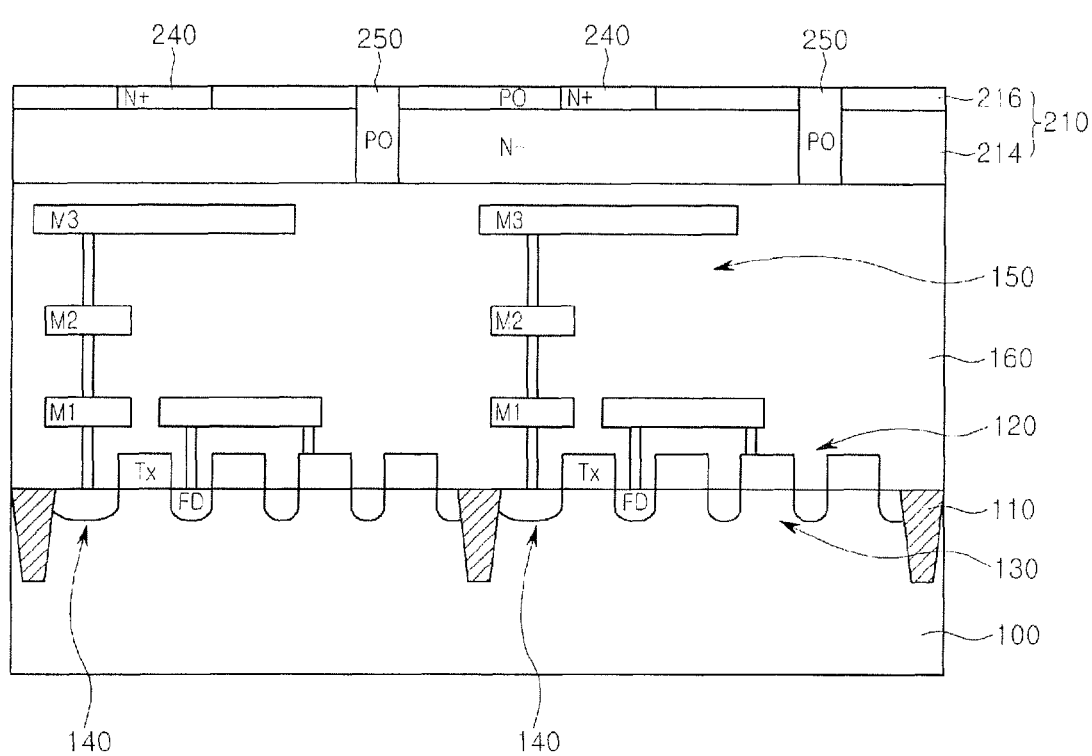

Next, as shown in FIG. 7, a pixel isolation ion implantation layer 250 may be formed at a boundary between pixels of the image sensing device 210. For example, the pixel isolation ion implantation layer 250 may be formed by a second conductive-type ion implantation.

According to an embodiment, a pixel isolation region for an image sensing device can be formed without a wafer-to-wafer alignment process. Also, since a voltage is applied to a photodiode through a via plug formed after an N+ ion implantation, the process for forming the via plug can be simplified.

Thereafter, ion implantation layers that are formed after a bonding may be activated through a heat treatment such as a laser annealing. Since the heat treatment by the laser annealing is locally performed, the heat treatment may not have an adverse thermal effect on respective components of the first substrate. For example, the laser annealing may be performed at an energy of about 600 mJ/cm$^2$ to about 1200 mJ/cm$^2$ to activate the first conductive-type ion implantation layer 240 and the pixel isolation ion implantation 250, but embodiments are not limited to the above energy.

Figure 8:
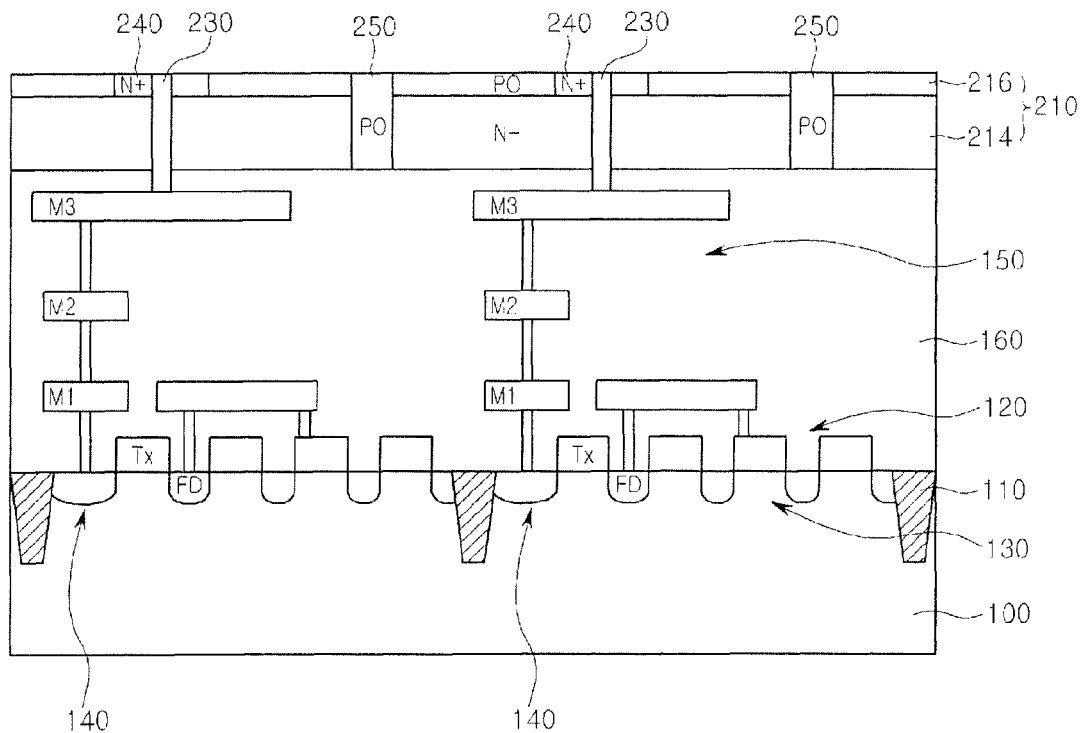

Next, as shown in FIG. 8, a via plug 230 penetrating the first conductive-type ion implantation layer 240 and the first conductive-type conductive layer 214 may be formed to electrically connect the first conductive-type conductive layer 214 to the interconnection 150.

For example, the via plug 230 may be formed in a hole in the image sensing device 210 at the upper part of the chip to apply a voltage to the image sensing device 210 and deliver photocharges to the readout circuitry 120 of the silicon substrate.

In this case, since the high-concentration N-type (n+) ion implantation layer 240 is formed in the second conductive-type conductive layer 216, and thus short-circuit is inhibited between the via plug 230 and the second conductive-type conductive layer 216, a separate process for removing the upper side of the via plug 230 may not be required.

Figure 9:
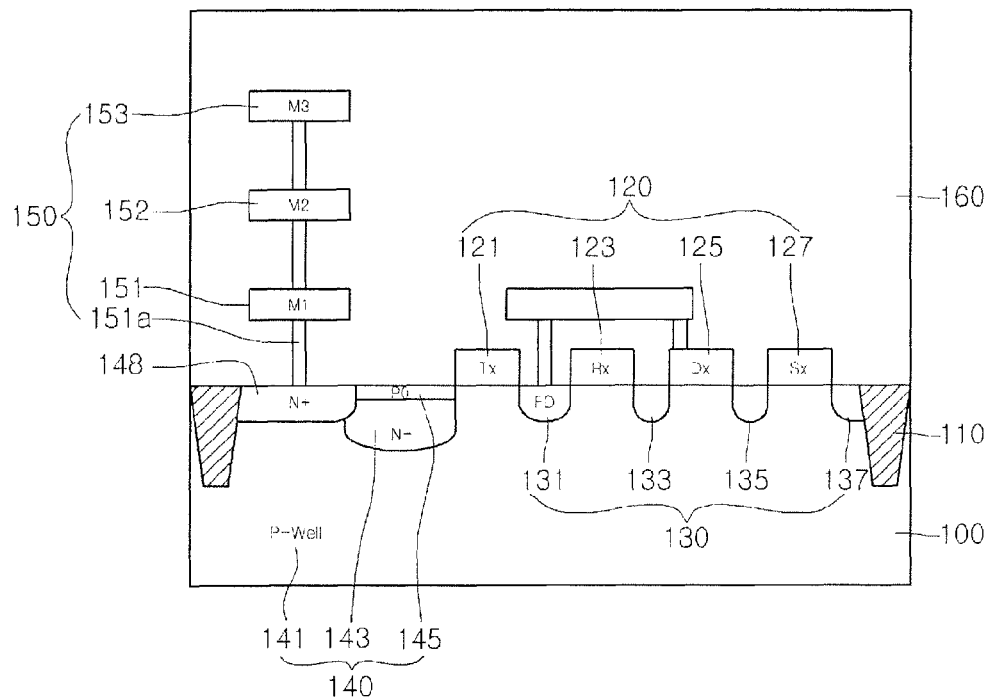
FIG. 9 is a cross-sectional view of an image sensor according to a second embodiment.

FIG. 9 is a cross-sectional view of an image sensor according to a second embodiment, and is a detailed view of a first substrate 100 where a readout circuitry 120, an electrical junction region 140, and an interconnection 150 are formed.

The second embodiment may adopt the technical features of the first embodiment.

In the second embodiment unlike the first embodiment, a first conductive-type connection 148 is formed at one side of the electrical junction region 140.

An N+ connection region 148 may be formed at a P0/N−/P− junction 140 for an ohmic contact. A process of forming an N+ connection region and a first metal contact 151a may provide a leakage source. This is because an electric field (EF) may be generated over the Si surface due to operation while a reverse bias is applied to P0/N−/P− junction 140. A crystal defect generated during the contact forming process inside the electric field may become a leakage source.

Also, when the N+ connection region is formed over the surface of P0/N−/P− junction 140, an electric field may be additionally generated due to N+/P0 junction 148/145. This electric field may also become a leakage source.

Therefore, the second embodiment proposes a layout in which first contact plug 151a is formed in an active region not doped with a P0 layer, but including N+ connection region 148 that is connected to N-junction 143.

According to the second embodiment, the electric field is not generated on and/or over the Si surface, which can contribute to reduction in a dark current of a 3D integrated CIS.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An image sensor comprising:
   a readout circuitry in a first substrate;
   an interconnection over the first substrate, the interconnection being electrically connected to the readout circuitry;
   an image sensing device over the interconnection, the image sensing device comprising a first conductive-type conductive layer and a second conductive-type conductive layer;
   a first conductive-type ion implantation layer in a portion of the second conductive-type conductive layer of the image sensing device; and
   a via plug penetrating through the first conductive-type ion implantation layer and the first conductive-type conductive layer, the via plug electrically connecting the first conductive-type conductive layer to the interconnection.

2. The image sensor according to claim 1, wherein the first conductive-type ion implantation layer is formed to have a depth greater than that of the second conductive-type conductive layer.

3. The image sensor according to claim 1, further comprising a pixel isolation ion implantation layer at a pixel boundary of the image sensing device.

4. The image sensor according to claim 3, wherein the pixel isolation ion implantation layer is a second conductive-type ion implantation layer.

5. The image sensor according to claim 1, further comprising an electrical junction region in the first substrate, the electrical junction region electrically connecting the interconnection to the readout circuitry.

6. The image sensor according to claim 5, wherein the electrical junction region comprises:
   a first conductive-type ion implantation region in the first substrate; and
   a second conductive-type ion implantation region on the first conductive-type ion implantation region.

7. The image sensor according to claim 5, further comprising a first conductive-type connection between the electrical junction region and the interconnection, the first conductive-type connection being electrically connected to the interconnection at an upper portion of the electrical junction region.

8. The image sensor according to claim 5, further comprising a first conductive-type connection between the electrical junction region and the interconnection, the first conductive-type connection being electrically connected to the interconnection at one side of the electrical junction region.

9. The image sensor according to claim 5, wherein the readout circuitry comprises a transistor, and wherein the electrical junction region is at a source region of the transistor and has an ion implantation concentration smaller than that of a floating diffusion region at a drain region of the transistor.

10. The image sensor according to claim 5, wherein the readout circuitry comprises a transistor, wherein the electrical junction region is at a source of the transistor and provides a charge potential difference between the source and a drain of the transistor.

11. A method for manufacturing an image sensor, comprising:
   forming a readout circuitry in a first substrate;
   forming an interconnection over the first substrate, the interconnection being electrically connected to the readout circuitry;
   forming an image sensing device over the interconnection, the image sensing device comprising a first conductive-type conductive layer and a second conductive-type conductive layer;
   forming a first conductive-type ion implantation layer in a portion of the second conductive-type conductive layer; and
   forming a via plug penetrating through the first conductive-type ion implantation layer and the first conductive-type conductive layer, the via plug electrically connecting the first conductive-type conductive layer to the interconnection.

12. The method according to claim 11, wherein the first conductive-type ion implantation layer is formed to have a depth greater than that of the second conductive-type conductive layer.

13. The method according to claim 11, after the forming of the image sensing device over the interconnection, further comprising forming a pixel isolation ion implantation layer at a pixel boundary of the image sensing device.

14. The method according to claim 13, wherein the pixel isolation ion implantation layer is a second conductive-type ion implantation layer, wherein the forming of the pixel isolation ion implantation layer comprises implanting the second conductive-type ions into the image sensing device at the pixel boundary.

15. The method according to claim 11, further comprising forming an electrical junction region in the first substrate, the electrical junction region electrically connecting the interconnection to the readout circuitry.

16. The method according to claim 15, wherein the forming of the electrical junction region comprises:
   forming a first conductive-type ion implantation region in the first substrate; and
   forming a second conductive-type ion implantation region on the first conductive-type ion implantation region.

17. The method according to claim 15, further comprising forming a first conductive-type connection between the electrical junction region and the interconnection.

18. The method according to claim 17, wherein the first conductive-type connection is formed at an upper portion of the electrical junction region.

19. The method according to claim 17, wherein the first conductive-type connection is formed at one side of the electrical junction region.

20. The method according to claim 15, wherein the readout circuitry comprises a transistor, and wherein the electrical junction region is formed at a source region of the transistor and has an ion implantation concentration smaller than that of a floating diffusion region formed at a drain region of the transistor.

* * * * *